(12) United States Patent
Cho et al.

(10) Patent No.: US 12,463,054 B2
(45) Date of Patent: Nov. 4, 2025

(54) METHOD OF FABRICATING A SEMICONDUCTOR DEVICE USING A SACRIFICIAL LAYER AND SEMICONDUCTOR DEVICE FABRICATED USING THE METHOD

(71) Applicant: Samsung Electronics Co., Ltd., Suwon-si (KR)

(72) Inventors: Mann Ho Cho, Seoul (KR); Gi Hyeon Kwon, Seoul (KR)

(73) Assignees: Samsung Electronics Co., Ltd., Gyeonggi-do (KR); industry-Academic Cooperation Foundation, Yonsei University, Seoul (KR)

( * ) Notice: Subject to any disclaimer, the term of this patent is extended or adjusted under 35 U.S.C. 154(b) by 351 days.

(21) Appl. No.: 17/968,169

(22) Filed: Oct. 18, 2022

(65) Prior Publication Data
US 2023/0274948 A1     Aug. 31, 2023

(30) Foreign Application Priority Data
Feb. 25, 2022  (KR) ........................ 10-2022-0025551

(51) Int. Cl.
*H01L 21/443* (2006.01)
*H01L 21/02* (2006.01)
(Continued)

(52) U.S. Cl.
CPC ...... *H01L 21/443* (2013.01); *H01L 21/02568* (2013.01); *H10D 48/362* (2025.01);
(Continued)

(58) Field of Classification Search
CPC . H01L 21/443; H01L 21/02568; H10D 99/00; H10D 62/80; H10D 64/62; H10D 48/362
(Continued)

(56) References Cited

U.S. PATENT DOCUMENTS 4,820,677 A * 4/1989 Jacobson ............... B01J 27/049
                                                                    502/220
9,147,824 B1   9/2015  Cao et al.
(Continued)

FOREIGN PATENT DOCUMENTS

KR         10-1025378 B1      3/2011
KR         10-1556449 B1      10/2015
(Continued)

OTHER PUBLICATIONS

Younghun Jung et al., "Transferred via Contacts as a Platform for Ideal Two-Dimensional Transistors" Nature Electronics, vol. 2, May 2019, pp. 187-194.
(Continued)

*Primary Examiner* — Norman D Richards
*Assistant Examiner* — Colin Russell McCutcheon
(74) *Attorney, Agent, or Firm* — Harness, Dickey & Pierce, P.L.C.

(57) ABSTRACT

A method of fabricating a semiconductor device includes forming a semiconductor layer, the semiconductor layer including a two-dimensional semiconductor material, forming a sacrificial layer on the semiconductor layer, forming a metal contact layer on the sacrificial layer, and removing the sacrificial layer. After the sacrificial layer is removed, the semiconductor layer and the metal contact layer are bonded to each other through a van der Waals bond.

10 Claims, 12 Drawing Sheets

(51) Int. Cl.
   *H10D 48/36* (2025.01)
   *H10D 62/80* (2025.01)
   *H10D 64/62* (2025.01)
   *H10D 99/00* (2025.01)
(52) U.S. Cl.
   CPC ............. *H10D 62/80* (2025.01); *H10D 64/62* (2025.01); *H10D 99/00* (2025.01)
(58) Field of Classification Search
   USPC .......................................................... 257/29
   See application file for complete search history.

(56) References Cited

U.S. PATENT DOCUMENTS

| | | | |
|---|---|---|---|
| 9,576,950 | B1 | 2/2017 | Yeo et al. |
| 9,608,101 | B2 | 3/2017 | Kis et al. |
| 9,768,313 | B2 | 9/2017 | Yeh et al. |
| 10,090,395 | B2 | 10/2018 | Grupp et al. |
| 10,790,356 | B2 | 9/2020 | Lee et al. |
| 11,094,811 | B2 | 8/2021 | Chen et al. |
| 2009/0001060 | A1* | 1/2009 | Orye ............... B23K 26/32 219/121.64 |
| 2014/0264494 | A1 | 9/2014 | Xu |
| 2021/0202265 | A1 | 7/2021 | Chuu et al. |
| 2022/0130724 | A1* | 4/2022 | Cen ..................... C23C 16/14 |
| 2023/0154791 | A1* | 5/2023 | Chung ............ H01L 21/76805 257/751 |
| 2024/0215459 | A1* | 6/2024 | Iwasaki ............. H10N 70/8828 |

FOREIGN PATENT DOCUMENTS

| | | |
|---|---|---|
| KR | 10-2019-0003223 A | 1/2019 |
| KR | 20210086927 A | 7/2021 |
| KR | 20210122645 A | 10/2021 |

OTHER PUBLICATIONS

Yuan Liu et al., "Approaching the Schottky-Mott limit in van der Waals metal-semiconductor junctions" 696, Nature, vol. 557, May 31, 2018.

Yan Wang et al., "Van der Waals contacts between three-dimensional metals and two-dimensional semiconductors" 70, Nature, vol. 568, Apr. 4, 2019.

* cited by examiner

METHOD OF FABRICATING A SEMICONDUCTOR DEVICE USING A SACRIFICIAL LAYER AND SEMICONDUCTOR DEVICE FABRICATED USING THE METHOD

CROSS-REFERENCE TO RELATED APPLICATIONS

This U.S. nonprovisional application claims priority under 35 U.S.C § 119 to Korean Patent Application No. 10-2022-0025551, filed on Feb. 25, 2022, in the Korean Intellectual Property Office, the disclosure of which is hereby incorporated by reference in its entirety.

FIELD

The present inventive concepts relate to a semiconductor device and a method of fabricating the same, and more particularly, to a semiconductor device including a two-dimensional material and a method of fabricating the same.

BACKGROUND

Semiconductor devices have an important role in the electronic industry because of their small size, multi-functionality, and/or low fabrication cost. The semiconductor devices may be categorized as any one of semiconductor memory devices that store logic data, semiconductor logic devices that process operations of logic data, and hybrid semiconductor devices that have both memory and logic elements. A semiconductor device has been increasingly desired or required for high integration with the advanced development of the electronic industry. For example, semiconductor devices have been increasingly requested for high reliability, high speed, and/or multi-functionality. Semiconductor devices are gradually becoming more complicated and more integrated to meet these requested characteristics.

As semiconductor devices become highly integrated, the scale down of transistors is also being accelerated and a two-dimensional semiconductor material has attracted attention. The two-dimensional semiconductor material is a sort of natural semiconductor having an atomic-scale thickness.

SUMMARY

Some example embodiments of the present inventive concepts provide a semiconductor device with improved electrical properties and a method of fabricating the same.

Some example embodiments of the present inventive concepts provide a semiconductor device with simplified structure and a method of fabricating the same.

According to some example embodiments of the present inventive concepts, a method of fabricating a semiconductor device includes forming a semiconductor layer, the semiconductor layer including a two-dimensional semiconductor material, forming a sacrificial layer on the semiconductor layer, forming a metal contact layer on the sacrificial layer, and removing the sacrificial layer. After the sacrificial layer is removed, the semiconductor layer and the metal contact layer are bonded to each other through a van der Waals bond.

According to some example embodiments of the present inventive concepts, a semiconductor device includes a semiconductor layer, the semiconductor layer including a two-dimensional semiconductor material, and a first metal contact layer on the semiconductor layer. The semiconductor layer and the first metal contact layer are bonded to each other through a van der Waals bond.

According to some example embodiments of the present inventive concepts, a semiconductor device includes a first semiconductor layer, a first metal layer bonded to the first semiconductor layer, a second semiconductor layer, and a second metal layer bonded to the second semiconductor layer. The first semiconductor layer and the second semiconductor layer include a same two-dimensional semiconductor material, the first metal layer and the second metal layer include a same metallic material, and a first interval between the first semiconductor layer and the first metal layer is greater than a second interval between the second semiconductor layer and the second metal layer.

DETAILED DESCRIPTION

The following will now describe a semiconductor device according to the present inventive concepts with reference to accompanying drawings.

Figure 1:
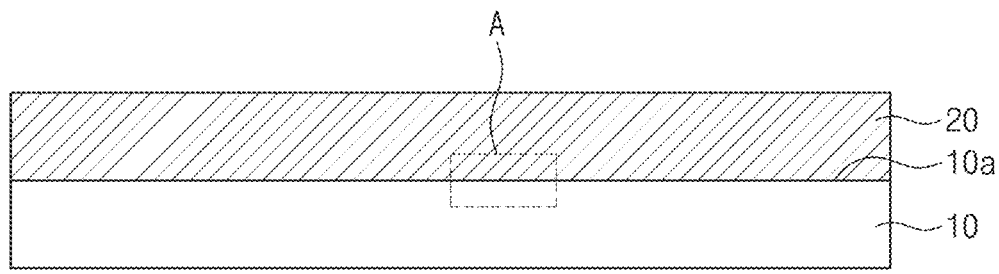
FIG. 1 illustrates a cross-sectional view showing a semiconductor device according to some example embodiments of the present inventive concepts.
Figure 2:
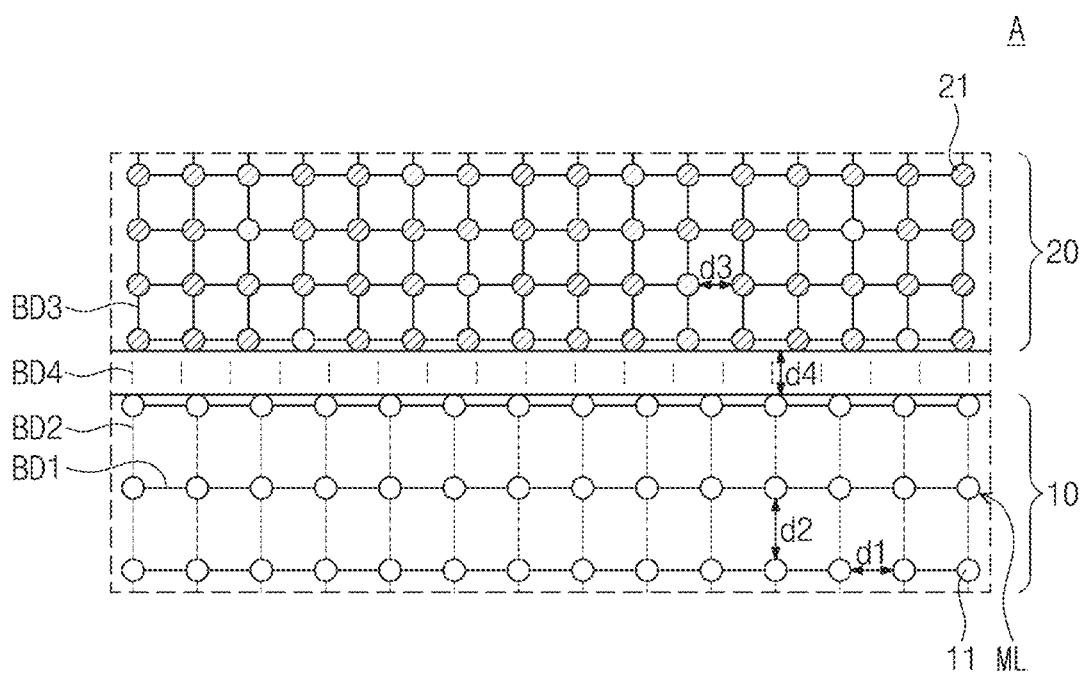
FIG. 2 illustrates an enlarged view showing section A of FIG. 1.

FIG. 1 illustrates a cross-sectional view showing a semiconductor device according to some example embodiments of the present inventive concepts. FIG. 2 illustrates an enlarged view showing section A of FIG. 1.

Referring to FIGS. 1 and 2, a semiconductor layer 10 may be provided. The semiconductor layer 10 may include a two-dimensional semiconductor material. For example, the semiconductor layer 10 may have a two-dimensional crystal structure. In this description, the two-dimensional crystal structure may mean a crystal structure in which a weak bond or van der Waals bond is made between molecular layers constituted by constituent atoms to thereby have a layered structure. The semiconductor layer 10 may have molecular layers ML, and based on a shape of the semiconductor layer 10, the molecular layers ML may be parallel to a top surface 10a of the semiconductor layer 10. For example, the semiconductor layer 10 may have a structure in which molecular layers ML of the semiconductor layer 10 are stacked in a direction perpendicular or substantially perpendicular to the top surface 10a of the semiconductor layer 10.

For more detail, as shown in FIG. 2, the semiconductor layer 10 may be formed of first elements 11. In this case, the first elements 11 positioned one molecular layer ML may have a first atomic bond BD1. The first atomic bond BD1 may be a covalent bond. A second atomic bond BD2 may be made between the first element 11 of one molecular layer ML and the first element 11 of another molecular layer ML. For example, neighboring molecular layers ML may be bonded to each other through the second atomic bond BD2 between the first elements 11. The second atomic bond BD2 may be a van der Waals bond. The first atomic bond BD1 or covalent bond may be stronger than the second atomic bond BD2 or van der Waals bond. Therefore, a first distance d1 between the first elements 11 in one molecular layer ML may be less than a second distance d2 between the molecular layers ML.

The semiconductor layer 10 may be a mono-molecular layer including a single molecular layer or a multi-molecular layer including a plurality of molecular layers. The two-dimensional semiconductor material may include two-dimensional transition metal dichalcogenide (TMD), graphene, or phosphorene. For example, the semiconductor layer 10 may include $MoS_2$, $MoSe_2$, $WS_2$, or $WSe_2$. The present inventive concepts, however, are not limited thereto, and the semiconductor layer 10 may include a two-dimensional crystal structure material which is used as a semiconductor material.

A contact layer 20 may be provided on the semiconductor layer 10. The contact layer 20 may include a metallic material, such as tungsten (W), titanium (Ti), or tantalum (Ta), but example embodiments are not limited thereto. For example, the contact layer 20 may be formed of second elements 21 that are metal atoms of the metallic material discussed above. In such a configuration, a third atomic bond BD3 may be made between the second elements 21 of the contact layer 20. The third atomic bond BD3 may be a metallic bond. The third atomic bond BD3 or metallic bond may be stronger than the second atomic bond BD2 or van der Waals bond. A third distance d3 between the second elements 21 may be different from the second distance d2 between the molecular layers ML of the semiconductor layer 10 and from the first distance d1 between the first elements 11. For example, the third distance d3 may be less than the second distance d2 and the first distance d1.

The contact layer 20 may be in contact with the top surface 10a of the semiconductor layer 10. The contact layer 20 and the semiconductor layer 10 may be connected to each other. For example, a bond between the second elements 21 of the contact layer 20 and the first elements 11 of the semiconductor layer 10 may be present on an interface 10a between the contact layer 20 and the semiconductor layer 10. The interface 10a between the contact layer 20 and the semiconductor layer 10 may be located at substantially the same position as that of the top surface 10a of the semiconductor layer 10, and thus the same reference numeral is allocated to the interface 10a and the top surface 10a. For example, as shown in FIG. 2, a fourth atomic bond BD4 may be made between the first elements 11 in the molecular layer ML of the semiconductor layer 10 most adjacent to the contact layer 20 and the second elements 21 in a molecular layer of the contact layer 20 most adjacent to the semiconductor layer 10.

For example, the second elements 21 positioned on a surface of the contact layer 20 may be bonded through the fourth atomic bond BD4 to the molecular layer ML positioned on a surface of the semiconductor layer 10. The fourth atomic bond BD4 may be a van der Waals bond. In this description, the phrase "the fourth atomic bond BD4 is a van der Waals bond" may mean that the van der Waals bond is a primary cause of the bond between the semiconductor layer 10 and the contact layer 20. The fourth atomic bond BD4 or van der Waals bond may be weaker than the first atomic bond BD1 or covalent bond and the third atomic bond BD3 or metallic bond.

Therefore, an interval or the fourth distance d4 between the semiconductor layer 10 and the contact layer 20 may be less than the first distance d1 between the first elements 11 in one molecular layer ML and the third distance d3 between the second elements 21 in one molecular layer. In some example embodiments, the fourth distance d4 between the semiconductor layer 10 and the contact layer 20 may indicate a distance between the second elements 21 positioned on a surface of the contact layer 20 and the first elements 11 positioned on a surface of the semiconductor layer 10.

According to some example embodiments of the present inventive concepts, because the first distance d1 between the first elements 11 is different from the second distance d2 between the second elements 21, no alignment may be made between the first and second elements 11 and 21 on the top surface 10a between the contact layer 20 and the semiconductor layer 10. For example, a lattice mismatch may be provided between the semiconductor layer 10 and the contact layer 20. For more detail, the contact layer 20 and the semiconductor layer 10 may be bonded to each other through a weak bond or van der Waals bond. Therefore, on the interface 10a, the second elements 21 may cause distortion of a crystal structure of the first elements 11, or the first elements 11 may cause distortion of a crystal structure of the second elements 21.

For example, on the interface 10a, a bonding force between the first elements 11 and the second elements 21 may inhibit or prevent deformation of crystal structures of the second elements 21 and the first elements 11. Therefore, a semiconductor device may be provided to have few crystal defects. For example, the number (or concentration) of crystal defects in the semiconductor layer 10 may be substantially identical or similar between an inside of the semiconductor layer 10 and a vicinity of the interface 10a.

Although the contact layer 20 includes a metallic material in some example embodiments, the present inventive concepts are not limited thereto. For example, the contact layer 20 may include a conductive two-dimensional material such as graphene, a conductive semiconductor material, conductive metal nitride, metal oxide, metal nitride, or metal oxynitride. When the contact layer 20 includes a conductive two-dimensional material, a bond between elements in one molecular layer of the contact layer 20 may be a covalent bond stronger than the fourth atomic bond BD4 or van der Waals bond.

When the contact layer 20 includes a semiconductor material or a conductive metal nitride, a bond may be made between elements of the contact layer 20 may be a covalent or ionic bond stronger than the fourth atomic bond BD4 or van der Waals bond. In some example embodiments, because the contact layer 20 and the semiconductor layer 10 are bonded to each other through a weak bond or van der Waals bond, crystal structures of the semiconductor layer 10 and the contact layer 20 may be prevented from distortion due to a lattice mismatch between the semiconductor layer 10 and the contact layer 20.

One or both of the semiconductor layer 10 and the contact layer 20 may include impurities. A concentration of the impurities may decrease with increasing distance from the interface 10a between the semiconductor layer 10 and the contact layer 20. The impurities may have a bonding energy less than that of the first elements 11 of the semiconductor layer 10 and that of the second elements of the contact layer 20. For example, the impurities may include sulfur (S), selenium (Se), tellurium (Te), chlorine (Cr), bromine (Br), iodine (I), mercury (Hg), cesium (Cs), potassium (K), phosphorus (P), sodium (Na), arsenic (As), magnesium (Mg), lithium (Li), rubidium (Rb), cadmium (Cd), zinc (Zn), strontium (Sr), or calcium (Ca). The present inventive concepts, however, are not limited thereto, and neither the semiconductor layer 10 nor the contact layer 20 may contain the impurities.

Figure 3:
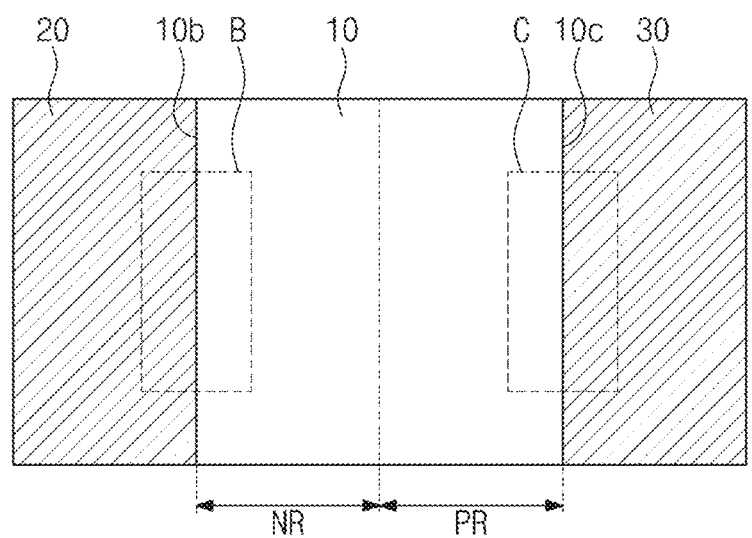
FIG. 3 illustrates a cross-sectional view showing a semiconductor device according to some example embodiments of the present inventive concepts.
Figure 4:
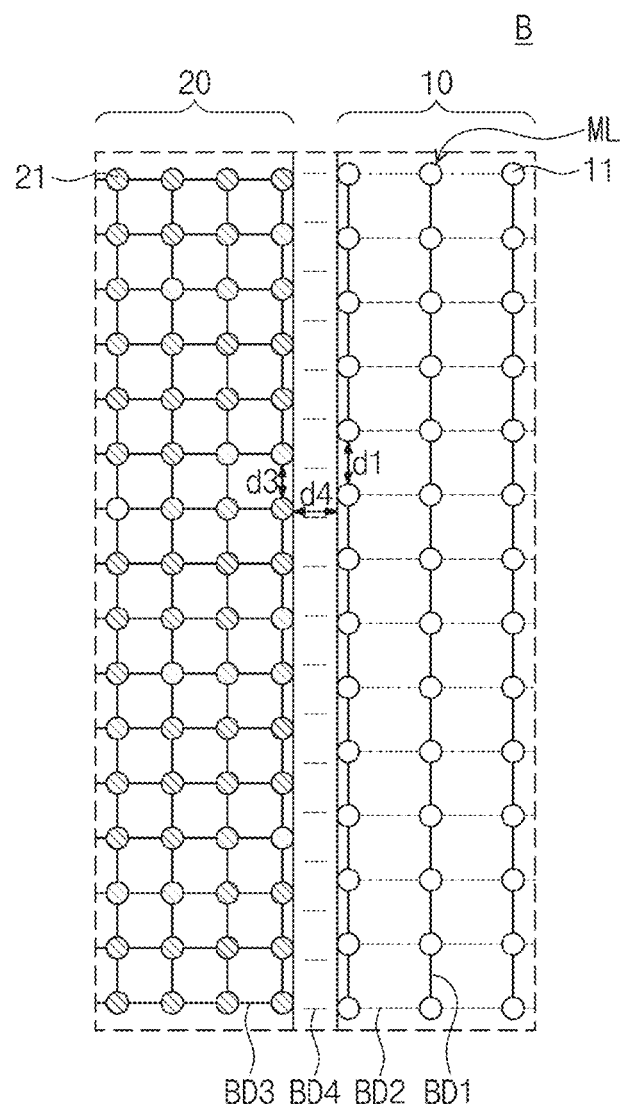
FIG. 4 illustrates an enlarged view showing section B of FIG. 3.
Figure 5:
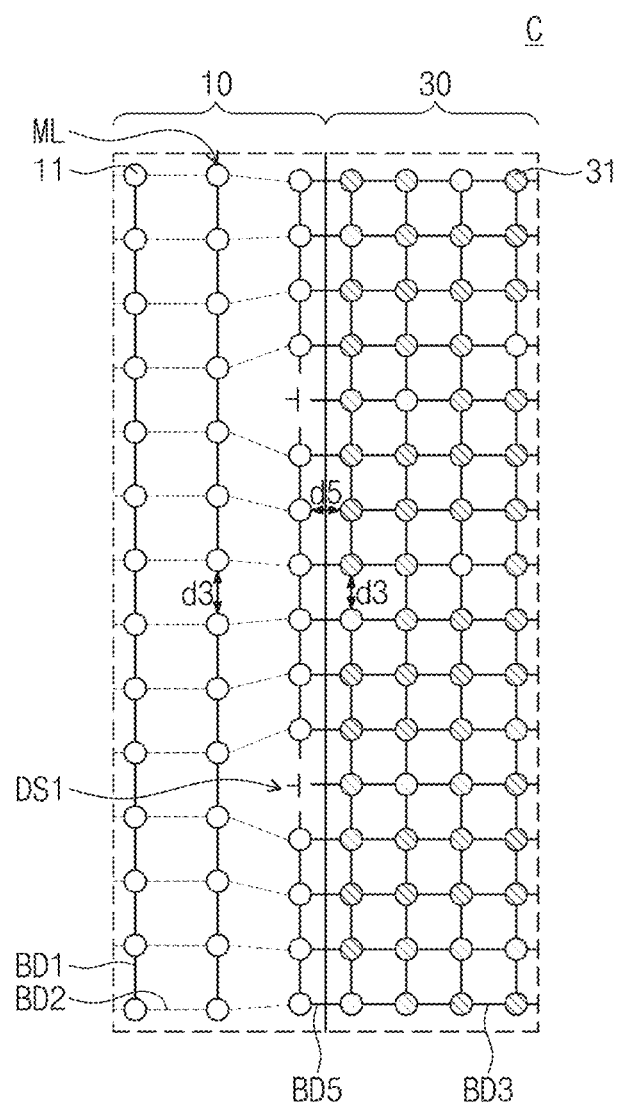
FIG. 5 illustrates an enlarged view showing section C of FIG. 3.

FIG. 3 illustrates a cross-sectional view showing a semiconductor device according to some example embodiments of the present inventive concepts. FIG. 4 illustrates an enlarged view showing section B of FIG. 3. FIG. 5 illustrates an enlarged view showing section C of FIG. 3. In the embodiments that follow, for brevity of description, components the same as those discussed with reference to FIGS. 1 and 2 are allocated the same reference numerals thereto, and a repetitive explanation thereof will be omitted or abridged. The following will focus on differences between the embodiments of FIGS. 1 and 2 and other embodiments described below.

Referring to FIGS. 3 to 5, a semiconductor layer 10 may be provided. The semiconductor layer 10 may have a first surface 10b and a second surface 10c that are opposite to each other. The first surface 10b and the second surface 10c may be parallel to each other. The semiconductor layer 10 may include a two-dimensional semiconductor material. The semiconductor layer 10 may have a structure in which molecular layers ML of the semiconductor layer 10 are stacked in a direction perpendicular or substantially perpendicular to the first and second surfaces 10b and 10c of the semiconductor layer 10. A first atomic bond BD1 may be made between first elements 11 positioned in one molecular layer ML. The first atomic bond BD1 may be a covalent bond. Neighboring molecular layers ML may be bonded to each other through a second atomic bond BD2 between the first elements 11. The second atomic bond BD2 may be a van der Waals bond.

A first contact layer 20 may be provided on the first surface 10b of the semiconductor layer 10. The first contact layer 20 may be substantially the same as the contact layer 20 discussed with reference to FIGS. 1 and 2. The first contact layer 20 may include a metallic material, such as tungsten (W), titanium (Ti), or tantalum (Ta), but example embodiments are not limited thereto. A third atomic bond BD3 may be made between second elements 21 of the first contact layer 20. The third atomic bond BD3 may be a metallic bond. A third distance d3 between the second elements 21 may be less than a second distance d2 between the molecular layers ML of the semiconductor layer 10 and a first distance d1 between the first elements 11.

The first contact layer 20 and the semiconductor layer 10 may be bonded to each other. For example, as shown in FIG. 4, a fourth atomic bond BD4 may be made between the molecular layer ML of the semiconductor layer 10 most adjacent to the first contact layer 20 and a molecular layer of the first contact layer 20 most adjacent to the semiconductor layer 10. The fourth atomic bond BD4 may be a van der Waals bond. A fourth distance d4 between the semiconductor layer 10 and the first contact layer 20 may be less than the first distance d1 between the first elements 11 in one molecular layer ML and a third distance d3 between the second elements 21.

On a first interface 10b between the semiconductor layer 10 and the first contact layer 20, a bonding force between the first elements 11 and the second elements 21 may inhibit or prevent deformation of crystal structures of the first elements 11 and the second elements 21. For example, a first region NR of the semiconductor layer 10 adjacent to the first contact layer 20 may have few crystal defects. In some example embodiments, the number (or concentration) of crystal defects in the first region NR of the semiconductor layer 10 may be substantially identical between an inside of the first region NR and a vicinity of the first interface 10b.

A second contact layer 30 may be provided on the second surface 10c of the semiconductor layer 10. The second contact layer 30 may include the same material as that of the first contact layer 20. For example, the second contact layer 30 may include a metallic material, such as tungsten (W), titanium (Ti), or tantalum (Ta), but example embodiments are not limited thereto. Alternatively, the second contact layer 30 may include a different material from that of the first contact layer 20. A third atomic bond BD3 may be made between third elements 31 of the second contact layer 30. The third atomic bond BD3 may be a metallic bond. A third distance d3 between the third elements 31 may be less than the second distance d2 between the molecular layers ML of the semiconductor layer 10 and the first distance d1 between the first elements 11.

The second contact layer 30 and the semiconductor layer 10 may be bonded to each other. For example, as shown in FIG. 5, a fifth atomic bond BD5 may be made between the molecular layer ML of the semiconductor layer 10 most adjacent to the second contact layer 30 and a molecular layer of the second contact layer 30 most adjacent to the semiconductor layer 10. The fifth atomic bond BD5 may be stronger than the fourth atomic bond BD4. For example, the fifth atomic bond BD5 may be a covalent bond, an ionic bond, or a mixture thereof. A fifth distance d5 between the semiconductor layer 10 and the second contact layer 30 may be less than the fourth distance d4 between the semiconductor layer 10 and the first contact layer 20.

The semiconductor layer 10 and the second contact layer 30 may have a lattice mismatch therebetween. In the vicinity of a second interface 10c between the semiconductor layer 10 and the second contact layer 30, a bonding force between the first elements 11 and the third elements 31 may be caused to deform a crystal structure of the first elements 11 included in the semiconductor layer 10. For example, on the second interface 10c, because a strong bond or covalent bond is made between the first elements 11 and the third elements 31, the first elements 11 adjacent to the second contact layer 30 may be aligned with the third elements 31. Because the first distance d1 between the first elements is different from the third distance d3 between the third elements 31, the first elements 11 of the semiconductor layer 10 may have a distorted crystal structure in the vicinity of the second interface 10c.

For example, in the vicinity of the second interface 10c, the first atomic bond BD1 may be broken between some of the first elements 11 and thus a crystal defect DS1 may be created. Therefore, a large number of crystal defects may be provided on a second region PR of the semiconductor layer 10 adjacent to the second contact layer 30. For example, the number (or concentration) of crystal defects in the second region PR of the semiconductor layer 10 may be greater in the vicinity of the second surface 10c than in an inside of the second region PR. In some example embodiments, the number (or concentration) of crystal defects may be greater in the second region PR of the semiconductor layer 10 than in the first region NR of the semiconductor layer 10.

When a large number of crystal defects are present on the second interface 10c between the second contact layer 30 and the second region PR of the semiconductor layer 10, a Schottky barrier between the semiconductor layer 10 and the second contact layer 30 may be freely adjusted based on a type of the second contact layer 30. For example, an increase in number of defects on a contact surface may induce that a Fermi level may be fixed between the semiconductor layer 10 and the second contact layer 30, and that the Schottky barrier may be formed regardless of work function of the second contact layer 30 bonded to the semiconductor layer 10. An increase in the number of crystal defects on the second interface 10c between the semiconductor layer 10 and the second contact layer 30 may induce difficulty in adjusting a height of the Schottky barrier formed based on work function. This may mean that it is difficult or impossible to fabricate a semiconductor device having a desired type even when appropriate work-function metal is used.

In contrast, crystal defects may be few on the first interface 10b between the first contact layer 20 and the first region NR of the semiconductor layer 10, and a Schottky barrier between the semiconductor layer 10 and the first contact layer 20 may be freely formed based on work function. This may mean that appropriate work-function metal is used to adjust the Schottky barrier to thereby fabricate a semiconductor device having a desired type such as an n-type or p-type.

Therefore, although the semiconductor layer 10 is coupled to the first contact layer 20 and the second contact layer 30 that are formed of the same material, the Schottky barrier between the semiconductor layer 10 and the first contact layer 20 may be different from the Schottky barrier between the semiconductor layer 10 and the second contact layer 30. This may be employed to allow the first and second regions NR and PR of the semiconductor layer 10 to have different types from each other. For example, based on the number (or concentration) of crystal defects in the semiconductor layer 10, the first region NR may be an n-type semiconductor region, and the second region PR may be a p-type semiconductor region. Therefore, a p-n conjunction may be formed by the first and second regions NR and PR of the semiconductor layer 10.

According to some example embodiments of the present inventive concepts, the first contact layer 20 and the second contact layer 30 may be connected to one semiconductor layer 10. The fourth atomic bond BD4 between the semiconductor layer 10 and the first contact layer 20 may be different from the fifth atomic bond BD5 between the semiconductor layer 10 and the second contact layer 30. Thus, one semiconductor layer 10 may be provided with the p-n junction therein, and a semiconductor device may be provided to have a simplified structure. In addition, the first and second contact layers 20 and 30 bonded to the semiconductor layer 10 may be formed of the same or substantially the same material to have the same or substantially the same structure, and a difference in bond type between the semiconductor layer 10 and the first and second contact layers 20 and 30 may be enough to provide the semiconductor layer 10 with semiconductor regions having different types from each other. As a result, a semiconductor device may be provided which has a simplified structure.

One or both of the semiconductor layer 10 and the first contact layer 20 may include impurities. A concentration of the impurities may decrease with increasing distance from the first interface 10b between the semiconductor layer 10 and the first contact layer 20. The impurities may have a bonding energy less than that of the first elements 11 of the semiconductor layer 10 and that of the second elements of the first contact layer 20. The second contact layer 30 may contain no impurity.

Figure 6:
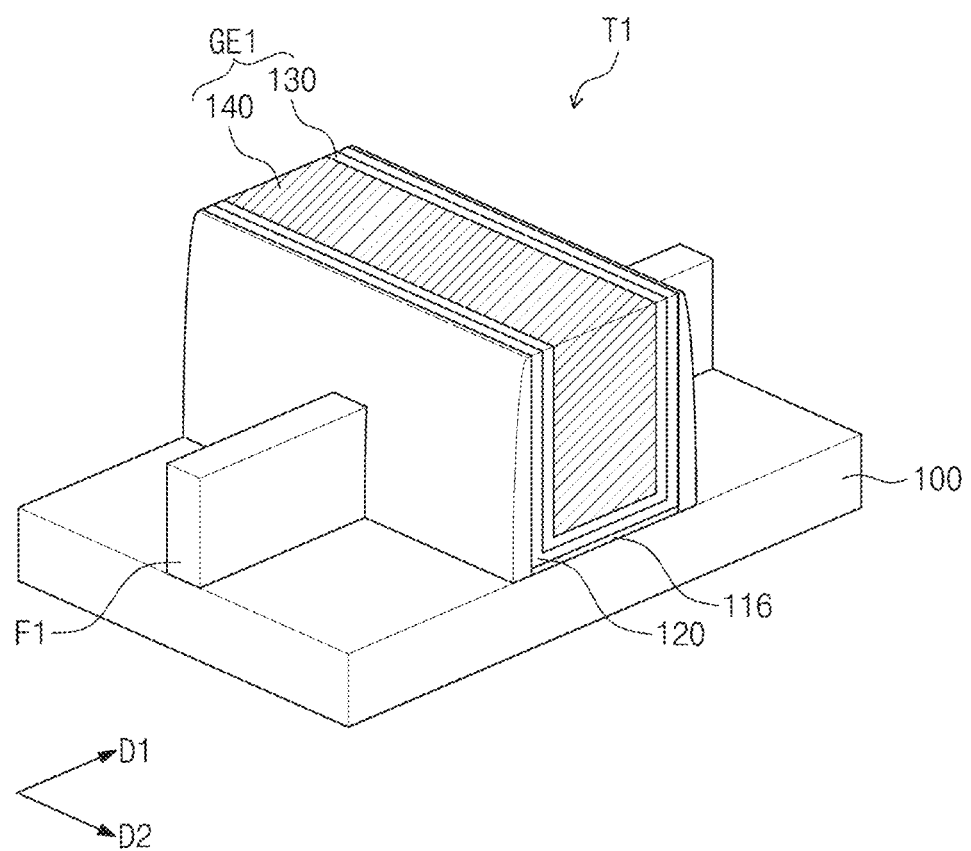
FIG. 6 illustrates a perspective view showing a semiconductor device according to some example embodiments of the present inventive concepts.
Figure 7:
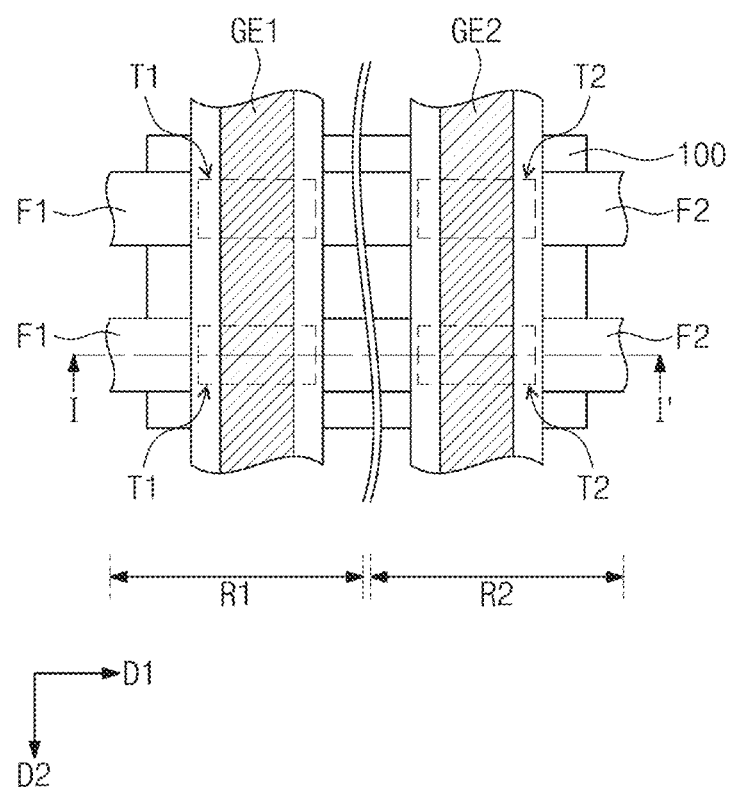
FIG. 7 illustrates a plan view showing a semiconductor device according to some example embodiments of the present inventive concepts.
Figure 8:
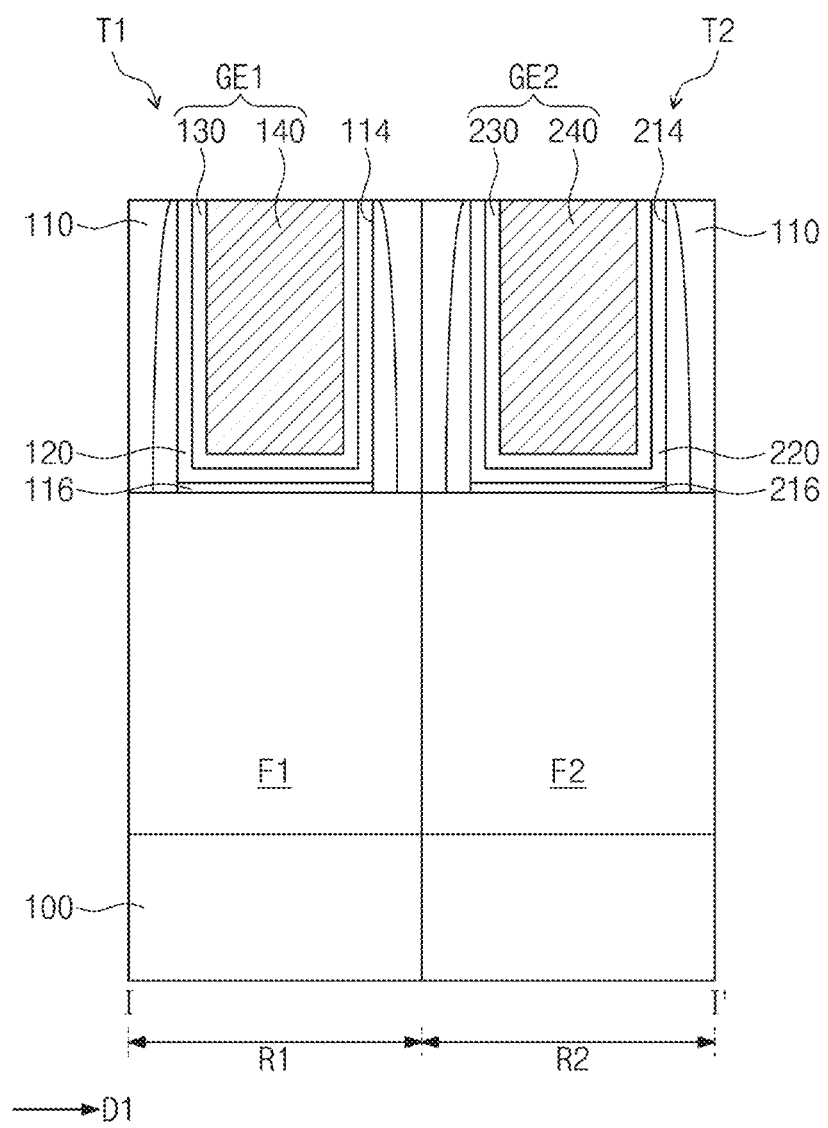
FIG. 8 illustrates a cross-sectional view taken along line I-I' of FIG. 6, showing a semiconductor device according to some example embodiments of the present inventive concepts.

FIG. 6 illustrates a perspective view showing a semiconductor device according to some example embodiments of the present inventive concepts. FIG. 7 illustrates a plan view showing a semiconductor device according to some example embodiments of the present inventive concepts. FIG. 8 illustrates a cross-sectional view taken along line I-I' of FIG. 6, showing a semiconductor device according to some example embodiments of the present inventive concepts.

Referring to FIGS. 6 to 8, a substrate 100 may be provided. The substrate 100 may have an active region. The substrate 100 may be a semiconductor substrate. For example, the semiconductor substrate may be a bulk silicon substrate, a silicon-on-insulator (SDI) substrate, a germanium substrate, a germanium-on-insulator (GOI) substrate, a silicon-germanium substrate, or an epitaxial thin-layer substrate obtained by performing a selective epitaxial growth (SEG) process, but example embodiments are not limited thereto. The bulk silicon substrate may be doped with n-type or p-type impurities. Alternatively, the semiconductor substrate may be a III-V group compound semiconductor substrate. For example, the III-V group compound semiconductor substrate may include at least one selected from gallium arsenide (GaAs), indium gallium arsenide (InGaAs), aluminum gallium arsenide (AlGaAs), and a mixture thereof, but example embodiments are not limited thereto.

The substrate 100 may be provided thereon with first and second transistors T1 and T2 having different threshold voltages from each other. The following will describe an example in which two transistors are provided, but the present inventive concepts are not limited thereto.

The first and transistors T1 and T2 may be respectively provided on first and second regions R1 and R2 of the substrate 100. Each of the first and second transistors T1 and T2 may be a finFET having a three-dimensional channel. The first and second transistors T1 and T2 may have their threshold voltages that are different from each other. The first transistor T1 may be a p-type transistor, and the second transistor T2 may be an n-type transistor. The present inventive concepts, however, are not limited thereto, and the first and second transistors T1 and T2 may have the same or substantially the same type transistor. FIG. 8 does not intend to show a boundary at which the first and second transistors T1 and T2 are in direct contact with each other, and the first and second transistors T1 and T2 may be electrically separated from each other.

The first transistor T1 will now be discussed as a representative of the first and second transistors T1 and T2, and the second transistor T2 will be explained in comparison with the first transistor T1. The first transistor T1 will be representatively described hereinafter with reference to FIG. 6, and structural features shown in FIG. 6 may be substantially the same as or similar to those of the second transistor T2.

Referring to FIGS. 6 to 8, the first transistor T1 may include a first fin F1, a first trench 114, a first interface layer 116, a first dielectric layer 120, and a first gate electrode GE1 that are provided on the first region R1 of the substrate 100.

The first fin F1 may be provided on the substrate 100. The first fin F1 may extend in a first direction D1 on the substrate 100. The first fin F1 may be a portion of the substrate 100 and an epitaxial layer grown from the substrate 100. The first fin F1 may include a semiconductor material, such as silicon (Si) or germanium (Ge). Alternatively, the first fin F1 may include a compound semiconductor, such as a IV group compound semiconductor or a III-V group compound semiconductor. For example, the IV group compound semiconductor may a binary or ternary compound including two or more of carbon (C), silicon (Si), germanium (Ge), and tin (Sn), or a compound in which an IV group element is doped into the binary or ternary compound. For example, the III-V group compound semiconductor may include one of binary, ternary, and quaternary compounds that is formed when at least one of III group elements, such as aluminum (Al), gallium (Ga), and indium (In), is combined with one of V group elements, such as phosphorous (P), arsenic (As) and antimony (Sb), but example embodiments are not limited thereto.

A first interlayer dielectric layer 110 may be provided on the substrate 100. A first trench 114 may be provided in the first interlayer dielectric layer 110. The first trench 114 may extend in a second direction D2 that intersects the first direction D1.

The first interface layer 116 may be disposed in the first trench 114. The first interface layer 116 may cover a bottom surface of the first trench 114 and may expose an inner sidewall of the first trench 114. The first interface layer 116 may include a silicon oxide (SiO) layer.

The first dielectric layer 120 may be disposed along the inner sidewall of the first trench 114. For example, the first dielectric layer 120 may conformally cover the inner sidewall and the bottom surface of the first trench 114. The first dielectric layer 120 may include a high-k dielectric layer. For example, the first dielectric layer 120 may include hafnium (Hf) or zirconium (Zr). In some example embodiments, the first dielectric layer 120 may include at least one selected from hafnium oxide ($HfO_2$), hafnium silicon oxide ($HfSiO_2$), hafnium oxynitride (HfON), zirconium oxide ($ZrO_2$), zirconium silicon oxide ($ZrSiO_4$), tantalum oxide ($Ta_2O_5$), titanium oxide ($TiO_2$), barium strontium titanium oxide (BSTO), barium titanium oxide ($BaTiO_3$), strontium titanium oxide ($SrTiO_3$), yttrium oxide ($Y_2O_3$), lead scandium tantalum oxide (PST), and lead zinc niobate (PZN), but example embodiments are not limited thereto.

The first gate electrode GE1 may be disposed in the first trench 114. The first gate electrode GE1 may include a first semiconductor layer 130 and a first metal layer 140.

The first semiconductor layer 130 may be disposed on the first dielectric layer 120 in the first trench 114. The first semiconductor layer 130 may be provided along a sidewall and a bottom surface of the first gate electrode GE1. The first semiconductor layer 130 may be a work-function adjustment layer for adjusting a work function of the first gate electrode GE1. The first semiconductor layer 130 may include a two-dimensional semiconductor material. For example, the first semiconductor layer 130 may have a two-dimensional crystal structure. The first semiconductor layer 130 may have molecular layers that are parallel to the inner sidewall and the bottom surface of the first trench 114.

The first metal layer 140 may be disposed on the first semiconductor layer 130 in the first trench 114. The first metal layer 140 may fill an unoccupied portion of the first trench 114. The first metal layer 140 may include a metallic material, such as tungsten (W), titanium (Ti), or tantalum (Ta), but example embodiments are not limited thereto.

The first metal layer 140 and the first semiconductor layer 130 may be bonded to each other. The bond between the first metal layer 140 and the first semiconductor layer 130 may be the same as or similar to that between the contact layer 20 and the semiconductor layer 10 discussed with reference to FIGS. 1 and 2. For example, on an interface between the first metal layer 140 and the first semiconductor layer 130, the first metal layer 140 and the first semiconductor layer 130 may be bonded to each other through a van der Waals bond between metal elements included in the first metal layer 140 and semiconductor elements included in the first semiconductor layer 130. On the interface between the first semiconductor layer 130 and the first metal layer 140, a bonding force between the metal elements and the semiconductor elements may prevent deformation of crystal structures of the first semiconductor layer 130 and the first metal layer 140. For example, crystal defects may be few in the first metal layer 140 and its adjacent first semiconductor layer 130.

The second transistor T2 may have a configuration substantially similar to that of the first transistor T1.

The second transistor T2 may include a second fin F2, a second trench 214, a second interface layer 216, a second dielectric layer 220, and a second gate electrode GE2 that are provided on the second region R2 of the substrate 100. The second gate electrode GE2 of the second transistor T2 may include a second semiconductor layer 230 and a second metal layer 240. The second semiconductor layer 230 may include the same or substantially the same material as that of the first semiconductor layer 130. The second metal layer 240 may include the same or substantially the same material as that of the first metal layer 140.

The second metal layer 240 and the second semiconductor layer 230 may be bonded to each other. A bond between the second metal layer 240 and the first semiconductor layer 130 may be the same as or similar to that between the second contact layer 30 and the semiconductor layer 10 discussed with reference to FIGS. 3 to 5. For example, on an interface between the second metal layer 240 and the second semiconductor layer 230, the second metal layer 240 and the second semiconductor layer 230 may be bonded to each other through a covalent bond between metal elements included in the second metal layer 240 and semiconductor elements included in the second semiconductor layer 230. An interval between the second metal layer 240 and the second semiconductor layer 230 may be less than that between the first metal layer 140 and the first semiconductor layer 130. On the interface between the second semiconductor layer 230 and the second metal layer 240, a bonding force between the metal elements and the semiconductor elements may be caused to deform crystal structures of the second semiconductor layer 230 and the second metal layer 240. For example, a large number of crystal defects may be provided in the second metal layer 240 and its adjacent second semiconductor layer 230.

The number (or concentration) of crystal defects in the first semiconductor layer 130 may be different from that of crystal defects in the second semiconductor layer 230. For example, the number (or concentration) of crystal defects in the first semiconductor layer 130 may be less than that of crystal defects in the second semiconductor layer 230. Therefore, the first gate electrode GE1 of the first transistor T1 may have a threshold voltage different from that of the second gate electrode GE2 of the second transistor T2.

According to some example embodiments of the present inventive concepts, the first transistor T1 and the second transistor T2 may be formed of the same or substantially the same material to have the same or substantially the same structure, and the substrate 100 may be provided thereon with the first and second gate electrodes GE1 and GE2 having different types from each other only by differentiating a bond type between the first semiconductor layer 130 and the first metal layer 140 from a bond type between the second semiconductor layer 230 and the second metal layer 240. As a result, a semiconductor device may be provided which has a simplified structure.

Figure 9:
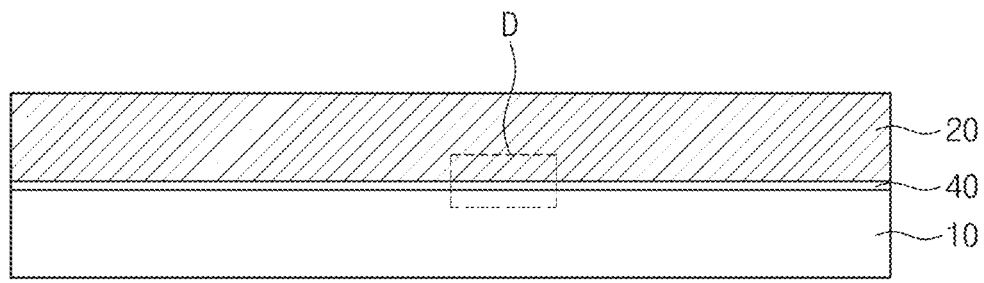
FIGS. 9, 10, 11 and 12 illustrate cross-sectional views showing a method of fabricating a semiconductor device according to some example embodiments of the present inventive concepts.
Figure 10:
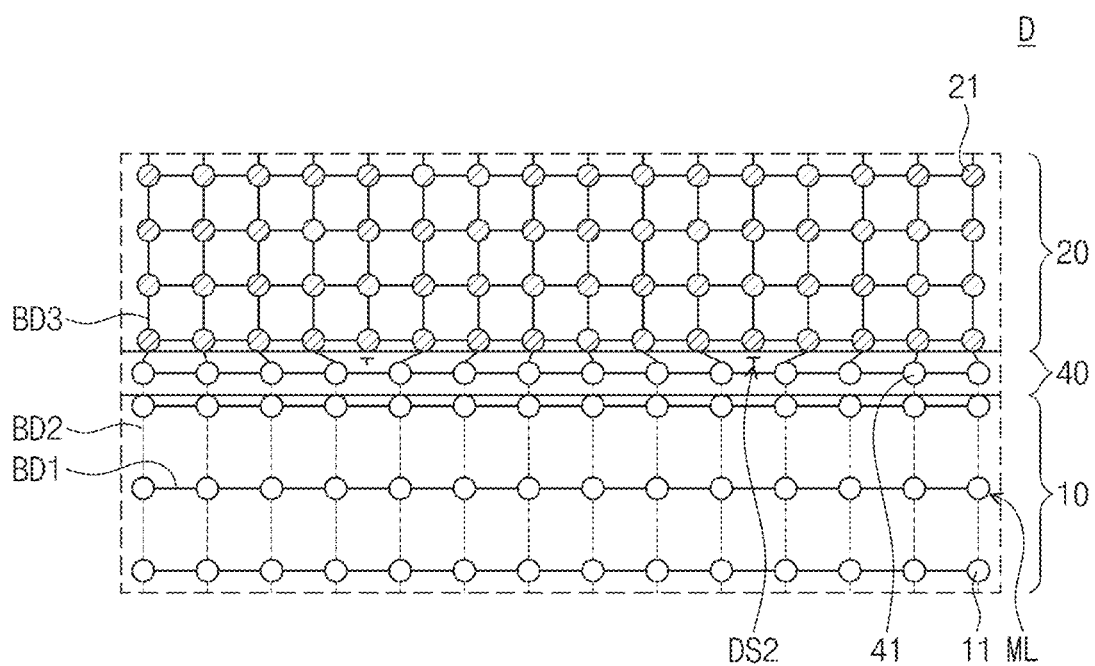
Figure 11:
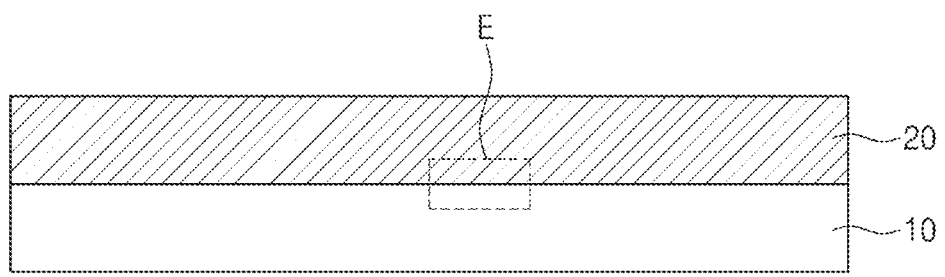
Figure 12:
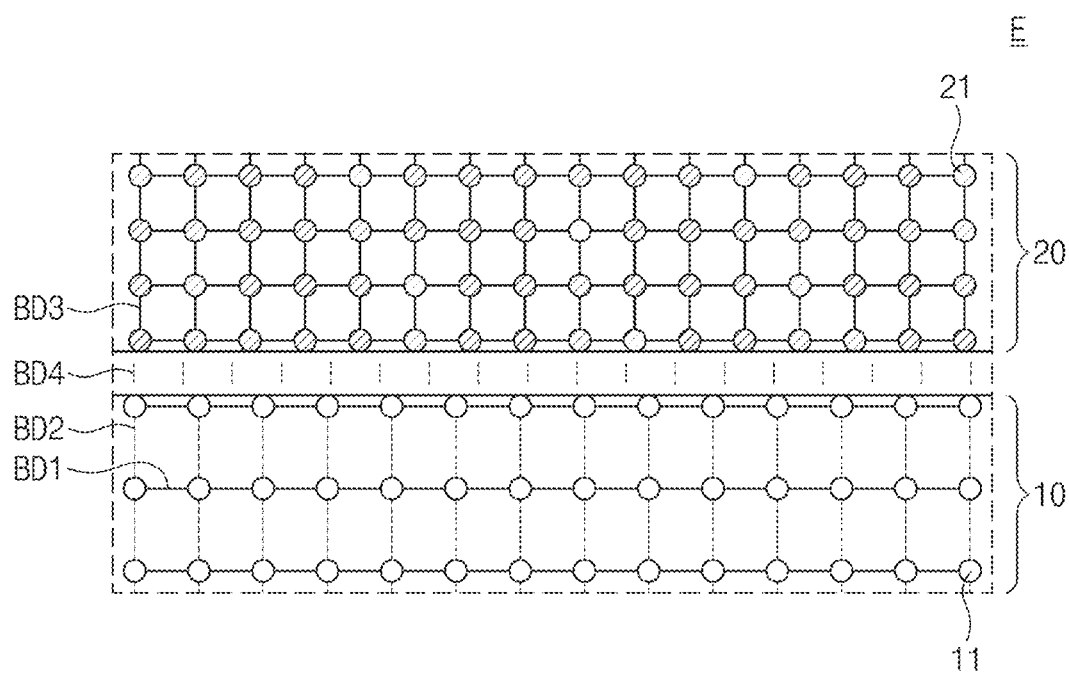

FIGS. 9 to 12 illustrate cross-sectional views showing a method of fabricating a semiconductor device according to some example embodiments of the present inventive concepts. FIGS. 9 and 11 illustrate cross-sectional views showing a method of fabricating a semiconductor device. FIGS. 10 and 12 illustrate enlarged views respectively showing sections D and E of FIGS. 9 and 10.

Referring to FIGS. 9 and 10, a semiconductor layer 10 may be formed. The semiconductor layer 10 may include a two-dimensional semiconductor material. For example, the semiconductor layer 10 may have a two-dimensional crystal structure. The semiconductor layer 10 may have molecular layers ML, and based on a shape of the semiconductor layer 10, the molecular layers ML may be parallel or substantially parallel to a top surface 10a of the semiconductor layer 10. For example, the semiconductor layer 10 may have a structure in which the molecular layers ML of the semiconductor layer 10 are stacked in a direction perpendicular or substantially perpendicular to the top surface 10a of the semiconductor layer 10. For more detail, as shown in FIG. 10, the semiconductor layer 10 may be formed of first elements 11. The first elements 11 positioned in one molecular layer ML may be bonded to each other through a first atomic bond BD1 or covalent bond. Neighboring molecular layers ML may be bonded to each other through a second atomic bond BD2 or van der Waals bond. The two-dimensional semiconductor material may include two-dimensional transition metal dichalcogenide (TMD), graphene, or phosphorene, but example embodiments are not limited thereto. For example, the semiconductor layer 10 may include $MoS_2$, $MoSe_2$, $WS_2$, or $WSe_2$.

A sacrificial layer 40 may be formed on the semiconductor layer 10. For example, a material of fourth elements 41 may be deposited on the semiconductor layer 10, thereby forming the sacrificial layer 40. The sacrificial layer 40 may be formed by using physical vapor deposition (PVD), chemical vapor deposition (CVD), or atomic layer deposition (ALD), but example embodiments are not limited thereto. The sacrificial layer 40 may be formed to have a small number of molecular layers. For example, as shown in FIG. 10, the sacrificial layer 40 may be formed which has a single molecular layer. Alternatively, the sacrificial layer 40 may be formed which has two to five (or more) molecular layers.

The fourth elements 41 included in the sacrificial layer 40 may be a bonding energy less than that of the first elements 11 included in the semiconductor layer 10 and that of second elements 21 included in a contact layer 20 which is formed in a subsequent process. For example, an evaporation point of the fourth element 41 may be less than that of the first element 11 and that of the second element 21. The sacrificial layer 40 may include sulfur (S), selenium (Se), tellurium (Te), chlorine (Cr), bromine (Br), iodine (I), mercury (Hg), cesium (Cs), potassium (K), phosphorus (P), sodium (Na), arsenic (As), magnesium (Mg), lithium (Li), rubidium (Rb), cadmium (Cd), zinc (Zn), strontium (Sr), or calcium (Ca), but example embodiments are not limited thereto.

A contact layer 20 may be formed on the sacrificial layer 40. For example, a material of second elements 21 may be deposited on the sacrificial layer 40, thereby forming the contact layer 20. The contact layer 20 may be formed by using physical vapor deposition (PVD), chemical vapor deposition (CVD), or atomic layer deposition (ALD). The second elements 21 of the contact layer 20 may be bonded to each other through a third atomic bond BD3 or metallic bond. The third atomic bond BD3 or metallic bond may be stronger than the third atomic bond BD3 or van der Waals bond. A distance between the second elements 21 may be less than that between the first elements 11 of the semiconductor layer 10. The contact layer 20 may include a metallic material, such as tungsten (W), titanium (Ti), or tantalum (Ta), but example embodiments are not limited thereto.

According to some example embodiments of the present inventive concepts, the sacrificial layer 40 may be formed between the semiconductor layer 10 and the contact layer 20. The fourth elements 41 of the sacrificial layer 40 may have a bonding force less than that of the first elements 11 of the semiconductor layer 10 and that of the second elements 21 of the contact layer 20. The sacrificial layer 40 may alleviate a lattice mismatch that can occur between the semiconductor layer 10 and the contact layer 20. For example, the sacrificial layer 40 may be a buffer layer between the semiconductor layer 10 and the contact layer 20. A crystal defect DS2 due to the lattice mismatch between the semiconductor layer 10 and the contact layer 20 may not occur in any of the semiconductor layer 10 and the contact layer 20, but may occur in the sacrificial layer 40. Therefore, no deformation may be imposed on the first elements 11 of the semiconductor layer 10 and on the second elements 21 of the contact layer 20. The number (or concentration) of crystal defects in the semiconductor layer 10 may be substantially identical or similar between an inside of the semiconductor layer 10 and a vicinity of an interface between the semiconductor layer 10 and the contact layer 20.

Referring to FIGS. 11 and 12, the sacrificial layer 40 may be removed. For example, an annealing process may be performed on the sacrificial layer 40. The annealing process may evaporate only the sacrificial layer 40 having a bonding force less than those of the semiconductor layer 10 and the contact layer 20, and the sacrificial layer 40 may be removed between the semiconductor layer 10 and the contact layer 20. However, the removal of the sacrificial layer 40 is not limited to that discussed above, and an etching process may be performed such that the sacrificial layer 40 is removed, but any of the semiconductor layer 10 and the contact layer 20 is not removed. The removal of the sacrificial layer 40 may break atomic bonds between the sacrificial layer 40 and the semiconductor layer 10 and atomic bonds between the sacrificial layer 40 and the contact layer 20. The semiconductor layer 10 and the contact layer 20 may be charged on their surfaces, and may be bonded to each other through a fourth atomic bond BD4 or van der Waals bond.

After the removal of the sacrificial layer 40, an interval between the semiconductor layer 10 and the contact layer 20 may be greater than a distance between the first elements 11 of the semiconductor layer 10 and a distance between the second elements 21 of the contact layer 20. After the removal of the sacrificial layer 40, the number (or concentration) of crystal defects in the semiconductor layer 10 may be substantially identical or similar between an inside of the semiconductor layer 10 and a vicinity of an interface between the semiconductor layer 10 and the contact layer 20.

After the sacrificial layer 40 is removed, some of atoms of fourth elements 41 in the sacrificial layer 40 may remain between the semiconductor layer 10 and the contact layer 20. Alternatively, some of atoms of the fourth elements 41 may diffuse into the semiconductor layer 10 and the contact layer 20. In this case, a concentration of the fourth elements 41 may decrease with increasing distance from an interface between the semiconductor layer 10 and the contact layer 20. Alternatively, the fourth elements 41 may not remain in the semiconductor layer 10, in the contact layer 20, and between the semiconductor layer 10 and the contact layer 20.

It may therefore be possible to fabricate the semiconductor device discussed with reference to FIGS. 1 and 2.

Figure 13:
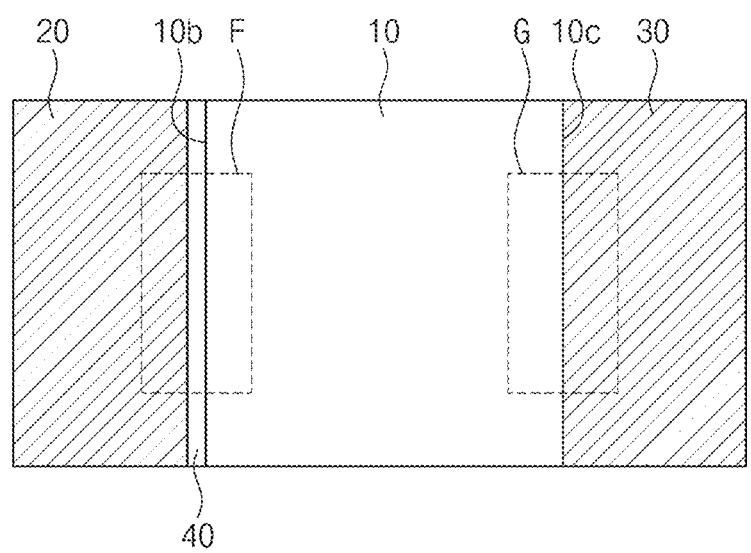
FIGS. 13, 14 and 15 illustrate cross-sectional views showing a method of fabricating a semiconductor device according to some example embodiments of the present inventive concepts.
Figure 14:
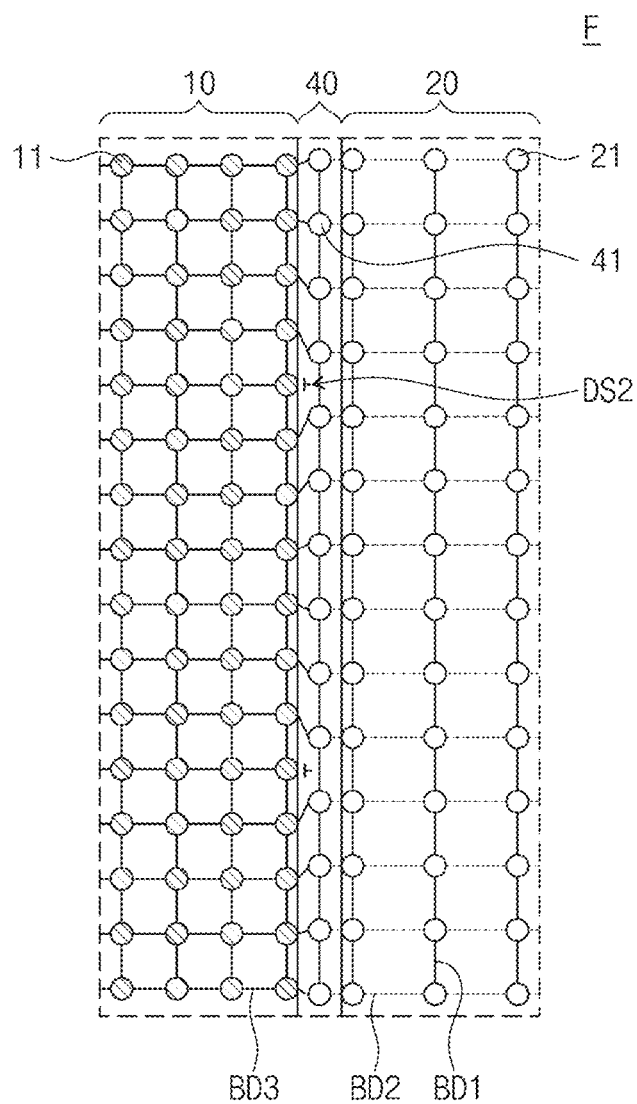
Figure 15:
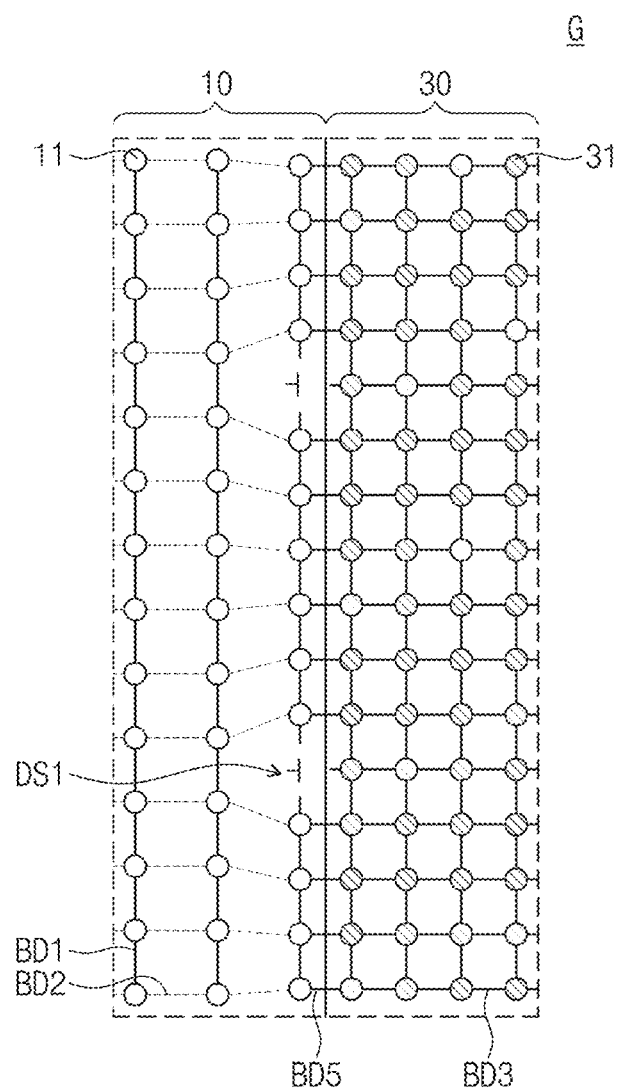

FIGS. 13 to 15 illustrate cross-sectional views showing a method of fabricating a semiconductor device according to some example embodiments of the present inventive concepts.

Referring to FIGS. 13 to 15, a semiconductor layer 10 may be formed. The semiconductor layer 10 may have a first surface 10b and a second surface 10c that are opposite to each other. The semiconductor layer 10 may include a two-dimensional semiconductor material. Based on a shape of the semiconductor layer 10, molecular layers ML of the semiconductor layer 10 may be parallel to the first and second surfaces 10b and 10c of the semiconductor layer 10. For example, the semiconductor layer 10 may have a structure in which the molecular layers ML of the semiconductor layer 10 are stacked in a direction perpendicular or substantially perpendicular to the first and second surfaces 10b and 10c of the semiconductor layer 10. For more detail, as shown in FIG. 14, the semiconductor layer 10 may be formed of first elements 11. In this case, the first elements 11 positioned in one molecular layer ML may be bonded to each other through a first atomic bond BD1 or covalent bond. Neighboring molecular layers ML may be bonded to each other through a second atomic bond BD2 or van der Waals bond. The two-dimensional semiconductor material may include two-dimensional transition metal dichalcogenide (TMD), graphene, or phosphorene, but example embodiments are not limited thereto.

A sacrificial layer 40 may be formed on the first surface 10b of the semiconductor layer 10. For example, a material of fourth elements 41 may be deposited on the first surface 10b of the semiconductor layer 10, thereby forming the sacrificial layer 40. The sacrificial layer 40 may be formed by using physical vapor deposition (PVD), chemical vapor deposition (CVD), or atomic layer deposition (ALD), but example embodiments are not limited thereto. The sacrificial layer 40 may be formed to have a small number of molecular layers. The fourth elements 41 included in the sacrificial layer 40 may have a bonding energy less than that of the first elements 11 included in the semiconductor layer 10 and that of second elements 21 included in a first contact layer 20 which is formed in a subsequent process. For example, an evaporation point of the fourth element 41 may be less than that of the first element 11 and that of the second element 21.

A first contact layer 20 may be formed on the sacrificial layer 40. For example, a material of second elements 21 may be deposited on the sacrificial layer 40, thereby forming the first contact layer 20. The first contact layer 20 may be formed by using physical vapor deposition (PVD), chemical vapor deposition (CVD), or atomic layer deposition (ALD), but example embodiments are not limited thereto. The second elements 21 of the first contact layer 20 may be bonded to each other through a third atomic bond BD3 or metallic bond.

The fourth elements 41 of the sacrificial layer 40 may have a bonding force less than that of the first elements 11 of the semiconductor layer 10 and that of the second elements 21 of the first contact layer 20. The sacrificial layer 40 may alleviate a lattice mismatch that can occur between the semiconductor layer 10 and the first contact layer 20. For example, a crystal defect DS2 due to the lattice mismatch between the semiconductor layer 10 and the first contact layer 20 may not occur in any of the semiconductor layer 10 and the contact layer 20, but may occur in the sacrificial layer 40. Therefore, no deformation may be imposed on the first elements 11 of the semiconductor layer 10 and on the second elements 21 of the first contact layer 20. The number (or concentration) of crystal defects in the semiconductor layer 10 may be small in the vicinity of an interface 10b between the semiconductor layer 10 and the sacrificial layer 40.

A second contact layer 30 may be formed on the second surface 10c of the semiconductor layer 10. For example, a material of third elements 31 may be deposited on the second surface 10c of the semiconductor layer 10, thereby forming the second contact layer 30. The second contact layer 30 may be formed by using physical vapor deposition (PVD), chemical vapor deposition (CVD), or atomic layer deposition (ALD), but example embodiments are not limited thereto. The third elements 31 of the second contact layer 30 may be bonded to each other through a third atomic bond BD3 or metallic bond.

The semiconductor layer 10 and the second contact layer 30 may have a lattice mismatch therebetween. In the vicinity of an interface 10c between the semiconductor layer 10 and the second contact layer 30, a bonding force between the first elements 11 and the third elements 31 may be caused to deform a crystal structure of the first elements 11 included in the semiconductor layer 10. In the vicinity of the interface 10c, the lattice mismatch may be caused to distort the crystal structure of the first elements 11 included in the semiconductor layer 10. For example, in the vicinity of the interface 10c, the first atomic bond BD1 may be broken between some of the first elements 11 and thus a crystal defect DS1 may be created. The number (or concentration) of crystal defects in the semiconductor layer 10 may be small in the vicinity of the interface 10c between the semiconductor layer 10 and the second contact layer 30.

For example, the number (or concentration) of crystal defects may be greater in a first portion of the semiconductor layer 10 adjacent to the first contact layer 20 than in a second portion of the semiconductor layer 10 adjacent to the second contact layer 30. Based on the number (or concentration) of crystal defects in the semiconductor layer 10, the first portion may be an n-type semiconductor region, and the second portion may be a p-type semiconductor region. For example, a p-n junction may be constituted by the first and second portions of the semiconductor layer 10.

Thereafter, the sacrificial layer 40 may be removed. For example, an annealing process may be performed on the sacrificial layer 40. The annealing process may evaporate only the sacrificial layer 40 having a bonding force less than those of the semiconductor layer 10 and the first contact layer 20, and the sacrificial layer 40 may be removed between the semiconductor layer 10 and the first contact layer 20. The removal of the sacrificial layer 40 may break atomic bonds between the sacrificial layer 40 and the semiconductor layer 10 and atomic bonds between the sacrificial layer 40 and the first contact layer 20. The semiconductor layer 10 and the first contact layer 20 may be charged on their surfaces, and may be bonded to each other through a fourth atomic bond BD4 or van der Waals bond.

It may therefore be possible to fabricate the semiconductor device discussed with reference to FIGS. 3 to 5.

According to some example embodiments of the present inventive concepts, a simplified process may be executed to form a p-n junction on one semiconductor material layer.

In a semiconductor device according to some example embodiments of the present inventive concepts, a metal contact layer and a semiconductor layer may be bonded to each other through a weak bond or van der Waals bond, and on an interface between the metal contact layer and the semiconductor layer, a bonding force between elements of the metal contact layer and the semiconductor layer may be caused to inhibit or prevent deformation of crystal structures of the metal contact layer and the semiconductor layer. In conclusion, the semiconductor device may have few crystal defects.

In addition, one semiconductor layer may have a p-n junction provided therein, and the semiconductor device may have a simplified structure. Moreover, first and second metal contact layers bonded to the semiconductor layer may be formed of the same or substantially the same material to have the same or substantially the same structure, and a difference in bond type between the semiconductor layer and the first and second metal contact layers may be enough to provide the semiconductor layer with semiconductor regions having different types from each other. As a result, the semiconductor device may have a simplified structure.

Furthermore, first and second transistors may be formed of the same or substantially the same material to have the same or substantially the same structure, and a difference in bond type between the semiconductor layer and the first and second metal contact layers may be enough to provide the semiconductor layer with gate electrodes having different types from each other. As a result, the semiconductor device may have a simplified structure.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

Although the present inventive concepts have been described in connection with some example embodiments of the present inventive concepts illustrated in the accompanying drawings, it will be understood that variations in form and detail may be made therein without departing from the present inventive concepts. The above disclosed embodiments should thus be considered illustrative and not restrictive.

What is claimed is:

1. A method of fabricating a semiconductor device, the method comprising:
   forming a semiconductor layer, the semiconductor layer including a two-dimensional semiconductor material;
   forming a sacrificial layer on the semiconductor layer;
   forming a metal contact layer on the sacrificial layer; and
   removing the sacrificial layer,
      wherein, after the sacrificial layer is removed, the semiconductor layer and the metal contact layer are bonded to each other through a van der Waals bond.

2. The method of claim 1, wherein the two-dimensional semiconductor material includes two-dimensional transition metal dichalcogenide.

3. The method of claim 2, wherein the two-dimensional semiconductor material includes at least one of $MoS_2$, $MoSe_2$, $WS_2$, and $WSe_2$.

4. The method of claim 1, wherein
   a bonding energy of a material in the sacrificial layer is less than a bonding energy of the two-dimensional semiconductor material, and
   the bonding energy of the material in the sacrificial layer is less than a bonding energy of a metallic material in the metal contact layer.

5. The method of claim 4, wherein
   an evaporation point of the material in the sacrificial layer is less than an evaporation point of the two-dimensional semiconductor material, and
   the evaporation point of the material in the sacrificial layer is less than an evaporation point of the metallic material.

6. The method of claim 4, wherein the material in the sacrificial layer includes at least one of sulfur(S), selenium (Se), tellurium (Te), chlorine (Cr), bromine (Br), iodine (I), mercury (Hg), cesium (Cs), potassium (K), phosphorus (P), sodium (Na), arsenic (As), magnesium (Mg), lithium (Li), rubidium (Rb), cadmium (Cd), zinc (Zn), strontium (Sr), and calcium (Ca).

7. The method of claim 1, wherein, after the sacrificial layer is removed,
   an interval between the semiconductor layer and the metal contact layer is greater than an interatomic distance in one molecular layer of the two-dimensional semiconductor material, and
   the interval between the semiconductor layer and the metal contact layer is greater than an interatomic distance of a metallic material in the metal contact layer.

8. The method of claim 1, wherein removing the sacrificial layer includes performing an annealing process to evaporate the sacrificial layer.

9. The method of claim 1, wherein, after the sacrificial layer is removed, a concentration of defects in the semiconductor layer is identical between an inside of the semiconductor layer and an interface between the semiconductor layer and the metal contact layer.

10. The method of claim 1, wherein forming the sacrificial layer includes forming the sacrificial layer that reduces a lattice mismatch between the semiconductor layer and the metal contact layer.

* * * * *